United States Patent
Op 't Eynde

(10) Patent No.: US 8,760,333 B2
(45) Date of Patent: Jun. 24, 2014

(54) VOLTAGE CONTROLLED OSCILLATOR (VCO) BASED ANALOG-DIGITAL CONVERTER

(76) Inventor: Frank Op 't Eynde, Leuven (BE)

( * ) Notice: Subject to any disclaimer, the term of this patent is extended or adjusted under 35 U.S.C. 154(b) by 155 days.

(21) Appl. No.: 13/392,851

(22) PCT Filed: Aug. 28, 2009

(86) PCT No.: PCT/BE2009/000046
§ 371 (c)(1),
(2), (4) Date: Feb. 27, 2012

(87) PCT Pub. No.: WO2011/022789
PCT Pub. Date: Mar. 3, 2011

(65) Prior Publication Data
US 2012/0154192 A1   Jun. 21, 2012

(51) Int. Cl.
*H03M 1/12*   (2006.01)
(52) U.S. Cl.
USPC ............................................. 341/155; 331/11
(58) Field of Classification Search
USPC ............. 341/155, 157; 318/268, 600; 331/11, 331/16, 34; 327/156
See application file for complete search history.

(56) References Cited

U.S. PATENT DOCUMENTS

| | | | |
|---|---|---|---|
| 5,189,420 A | 2/1993 | Eddy et al. | |
| 6,396,890 B1 * | 5/2002 | Turner | 375/376 |
| 6,809,676 B1 | 10/2004 | Younis et al. | |
| 7,173,501 B1 * | 2/2007 | Varricchione | 331/176 |
| 8,283,984 B2 * | 10/2012 | Lin | 331/11 |
| 2007/0229118 A1 * | 10/2007 | Kobayashi et al. | 327/3 |
| 2012/0087420 A1 * | 4/2012 | Kim | 375/259 |

OTHER PUBLICATIONS

International Search Authority/European Patent Office (ISA/EP). International Search Report, Application No. PCT/BE09/00046. Aug. 17, 2010.
International Preliminary Examining Authority/European Patent Office (IPEA/EP). International Preliminary Report on Patentability, Application No. PCT/BE09/00046. Sep. 26, 2011.
Høvin, Mats, et al. "Delta-Sigma Modulators Using Frequency-Modulated Intermediate Values." IEEE Journal of Solid-State Circuits, vol. 32, No. 1, pp. 13-22 (Jan. 1997).
Park, Matt, et al. "A 0.13 μm CMOS 78dB SNDR 87 mW 20 MHz BW CT ΔΣ ADC with VCO-Based Integrator and Quantizer." Solid-State Circuits Conference—Digest of Technical Papers, 2009, pp. 170-171, 171a. ISSCC 2009. IEEE International. Presented at 2009 IEEE International Solid-State Circuits Conference, Feb. 10, 2009.
Watanabe, Takamoto, et al. "An All-Digital Analog-to-Digital Converter With 12-μV/LSB Using Moving Average Filtering." IEEE Journal of Solid-State Circuits, vol. 38, No. 1, pp. 120-125 (Jan. 2003).

* cited by examiner

*Primary Examiner* — Peguy Jean Pierre
(74) *Attorney, Agent, or Firm* — The Marbury Law Group, PLLC

(57) ABSTRACT

A signal receiver contains a VCO-based Analog-to-Digital Converter. As a result, some building blocks can be migrated into the digital domain.

24 Claims, 7 Drawing Sheets

VOLTAGE CONTROLLED OSCILLATOR (VCO) BASED ANALOG-DIGITAL CONVERTER

FIELD OF THE INVENTION

This invention relates to signal receivers for Wireless Communications or for Wired Communications.

STATE OF THE ART

Wireless communications signal receivers are widely used in many systems such as e.g. radio or TV broadcasting, mobile phones, wireless LAN networks or Bluetooth networks. Similarly, Wired communications signal receivers are widely used, e.g. in the fields of digital telephone line communications (ISDN, ADSL), cable TV communications (DOCSIS) or optical communications (PON, under-sea cables). Production quantities of such devices amount to over one billion units per year. It is therefore not surprising that ever-continuing efforts are made to reduce the production cost of these devices.

Thanks to a continuing increase in transistor density of microelectronics Integrated Circuits, the cost of Digital electronic functions decreases year after year. Therefore, there is a continuous search for reducing the amount of Analog circuits at the expense of an increased amount of Digital functions. A modern communications receiver typically contains i) an analog frontend that amplifies and conditions analog signals, ii) a set of Analog-to-Digital Converters (ADC) and iii) Digital circuits that treat the signals in the digital domain.

As stated above, it is generally advantageous to reduce the content of blocks i) and ii), even if this requires an increase of the complexity and cost of block iii).

A State-of-the-art Wireless signal receiver is depicted in FIG. 1a): the input signal (1) is first applied to a Low-noise Amplifier (2), then converted to a (normally) lower frequency by means of one or more downconversion elements (3), then filtered by one or more filtering elements (4). Typically, there are also one or more Variable-Gain Amplifiers (VGA) (5), to increase the amplitude of the wanted signal close to a predefined value. The general purpose of blocks (2) to (5) is to increase the signal amplitude, lower its bandwidth and reduce its dynamic range by filtering out some large unwanted signals present in the input signal. Only when bandwidth and dynamic range are sufficiently reduced, conversion from Analog to Digital can occur. This conversion is performed by one or more Analog-to-Digital Converters (ADC) (6).

There is a strive to reducing the complexity of this system. In an ideal situation, the Wireless input signal would be immediately applied to an Analog-to-Digital Converter, as depicted in FIG. 1b), and all signal operations such as downconversion, filtering or Variable-Gain are performed in the digital domain. However, in most applications, this approach requires an Analog-to-Digital Converter with a dynamic range and/or with bandwidth requirements that are either unfeasible or cannot be reached with a reasonable manufacturing cost or power consumption. Even when a first signal amplification, by means of an LNA, occurs before conversion to digital, the approach of FIG. 1b) is generally unfeasible or economically unacceptable.

An intermediate approach is shown in FIG. 1c): First signal amplification and downconversion still occur in the analog domain, but the unfiltered signal is applied to one or more Analog-to-Digital Converters. Signal filtering and Variable-Gain Amplification occur in the digital domain. Although this approach is known, it is still considered very difficult. Indeed, the Analog-to-Digital Converters have to accommodate for the whole dynamic range of the input signal, plus all unwanted blockers and interferers, while still maintaining low-noise performance. And on the other hand, the sampling rate has to be large enough to process the whole, unfiltered input signal, including out-of-band blockers and interferers with a high frequency.

For example, consider the requirements of a Wireless-LAN system, also known as WiFi or IEEE802.11. The maximum peak input signal amplitude for this system is −20 dBm while the noise floor is at −101 dBm. If we allow for a noise degradation by the Analog-to-Digital Converters of 0.5 dB, the noise added by the Analog-to-Digital Converters has to be lower than −110 dBm. This means, a dynamic range of 90 dB. On the other hand, the Analog-to-Digital Converters have to sample the input signal at a sampling rate of at least 200 MHz, in order to process out-of-band blockers with frequencies of up to 100 MHz. The State-of-the-Art does not allow realising such Analog-to-Digital Converters within the power budget or within the cost target for such functions.

For some Wireline communications receivers, the situation is similar. E.g. the block schematics of FIG. 1a-c) are also valid for Cable Modem receivers. There also, FIG. 1b) is considered unfeasible at present.

AIMS OF THE INVENTION

The invention aims at further reducing the analog part of Wireless or Wireline communications signal receivers.

SUMMARY OF THE INVENTION

The invention is mainly based on two novel principles:
a) In the numerical example presented above, an Analog-to-Digital Converters with a dynamic range (Signal-to-Noise Ratio or SNR) of 90 dB was required. Most Analog-to-Digital Converters are designed for a high SNR, but also for a high linearity. This linearity is expressed as "Signal-to-Noise-plus-Distortion-Range" (SNDR). E.g. an Analog-to-Digital Converter with an SNR of 90 dB is often designed as such that two signal tones with each an amplitude of half of the Full-Scale, produce an intermodulation product of 90 dB below Full-Scale. However, the linearity requirements in Wireless Communications systems are by far not that stringent. These linearity requirements are normally expressed as a "Third-order Intermodulation intercept point" (IP3). E.g. for a Wireless LAN system, IP3 is specified at about −10 dBm. Hence, two signal tones with each an amplitude of half of the Full-Scale (=−26 dBm) are allowed to produce an intermodulation product of −58 dBm, or only 38 dB below Full-Scale. We can exploit this relaxed linearity requirement to reduce the complexity, power consumption and cost of the Analog-to-Digital Converters of FIG. 1b). VCO-based Analog-to-Digital Converters offer good SNR performance but lower linearity. Such Analog-to-Digital Converters are already reported in [1-2]. In [2], this type of Analog-to-Digital Converters was used in a Sensor Interface. But their particular usefulness for Wireless or Wired communications was never recognised, and therefore constitutes a novelty.
b) Below, a technique will be presented to increase the linearity and/or the sampling rate of VCO-based Analog-to-Digital Converters. Thanks to this technique, the requirements of Wireless communications devices come within reach of VCO-based Analog-to-Digital Converters. This constitutes a second novelty.

Similar considerations are valid for some Wired communications devices.

All these principles will be detailed further down.

SHORT DESCRIPTION OF THE DRAWINGS

FIGS. 1A, 1B, and 1C illustrate various implementations of Wireless communications devices.

Figure 5A:
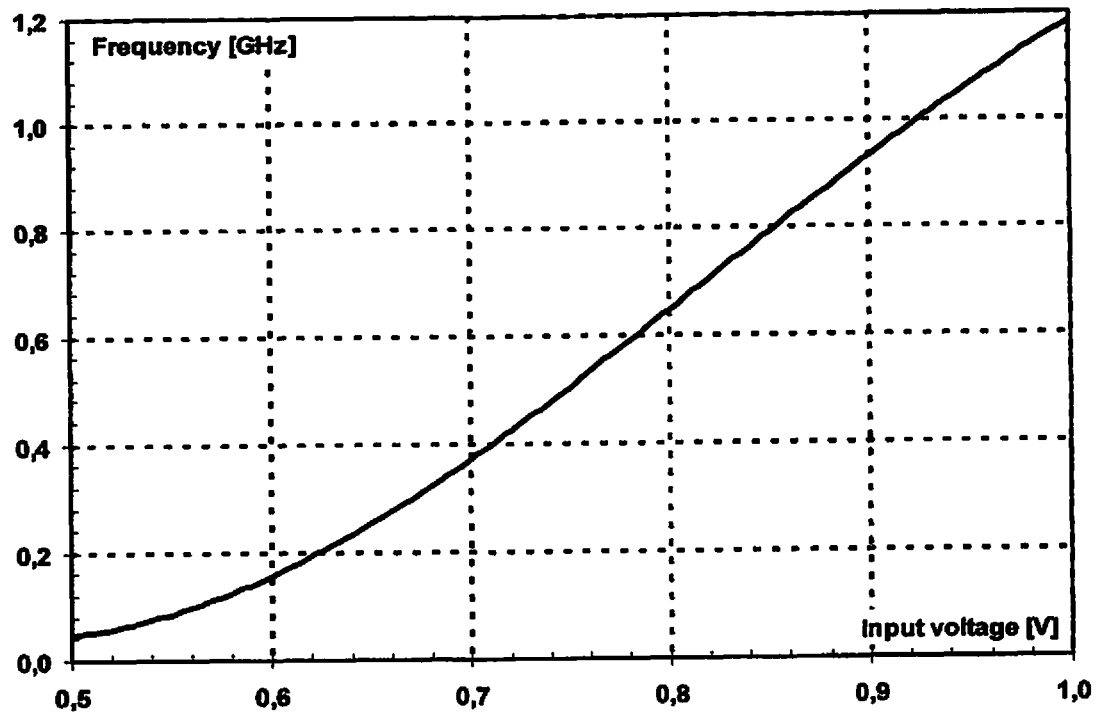

FIGS. 5A and B, illustrate an improved linearity characteristic according to an embodiment.

Figure 6:
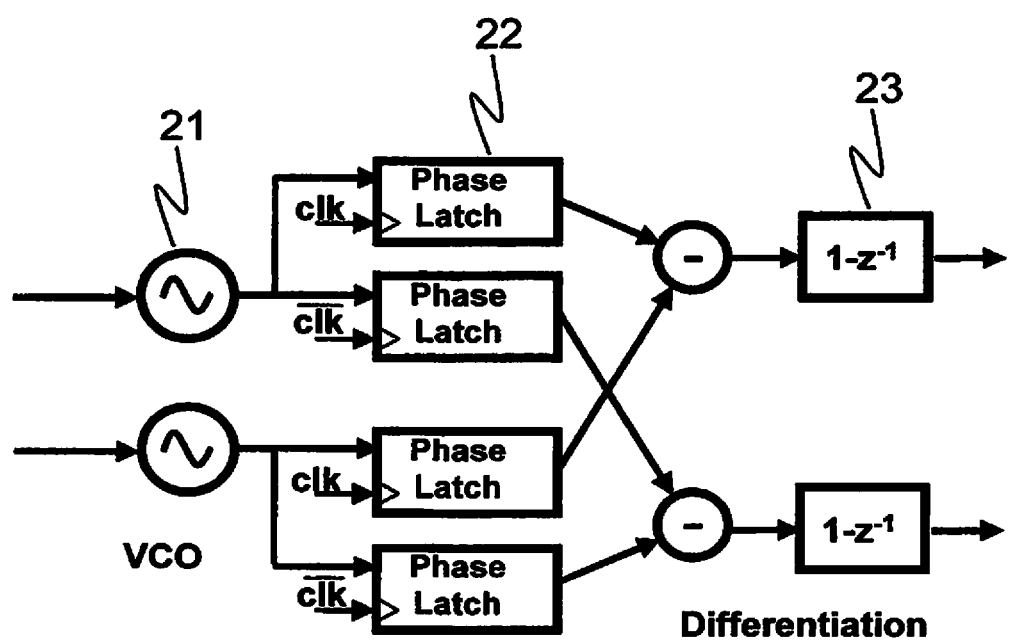

In FIG. 6, an improved VCO-based Analog-to-Digital Converter with double effective sampling rate is shown.

Figure 7:
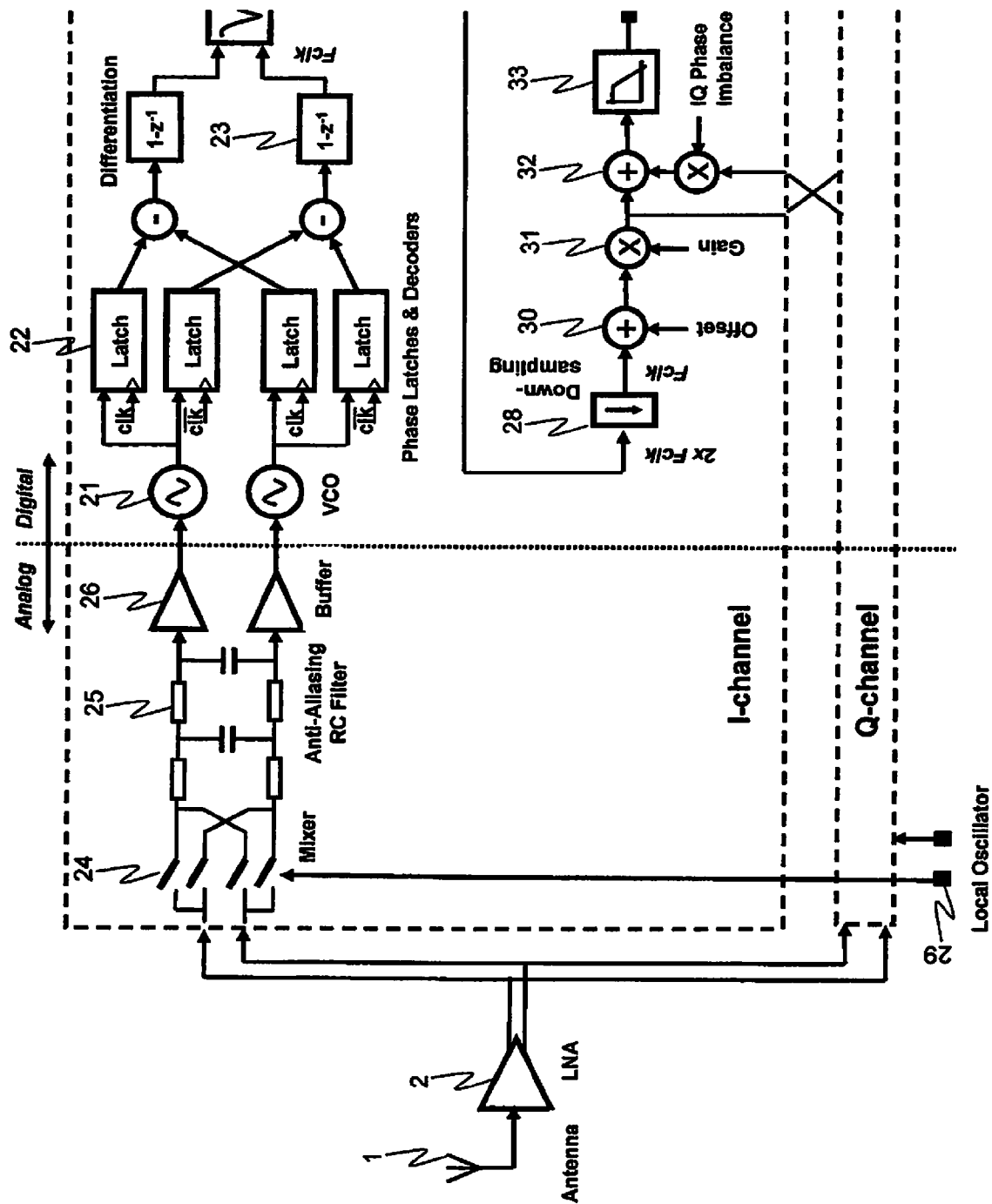
Figure 7:
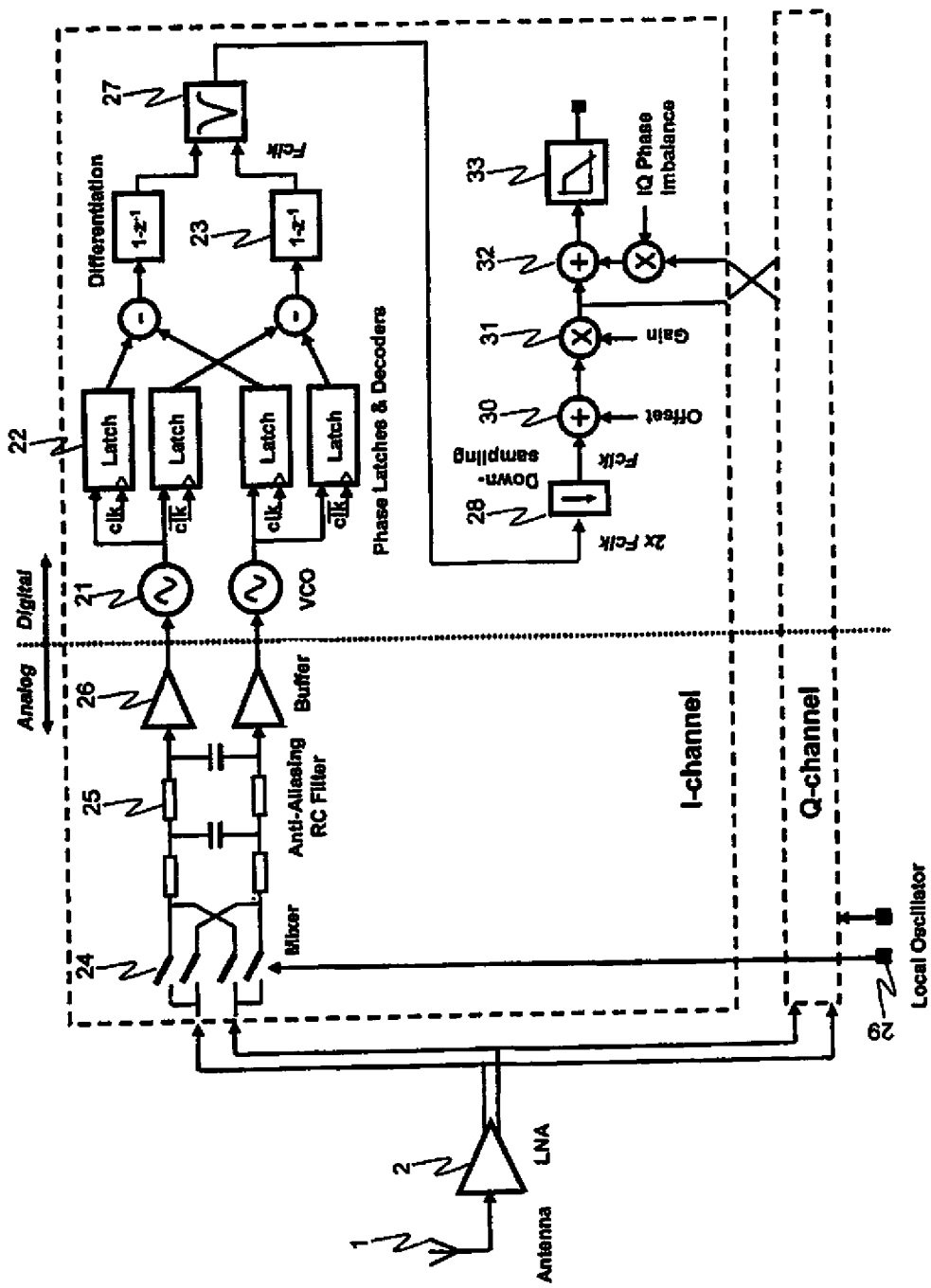

In FIG. 7, this VCO-based Analog-to-Digital Converter is implemented in a Wireless receiver

DETAILED DESCRIPTION OF THE INVENTION

Figure 1A:
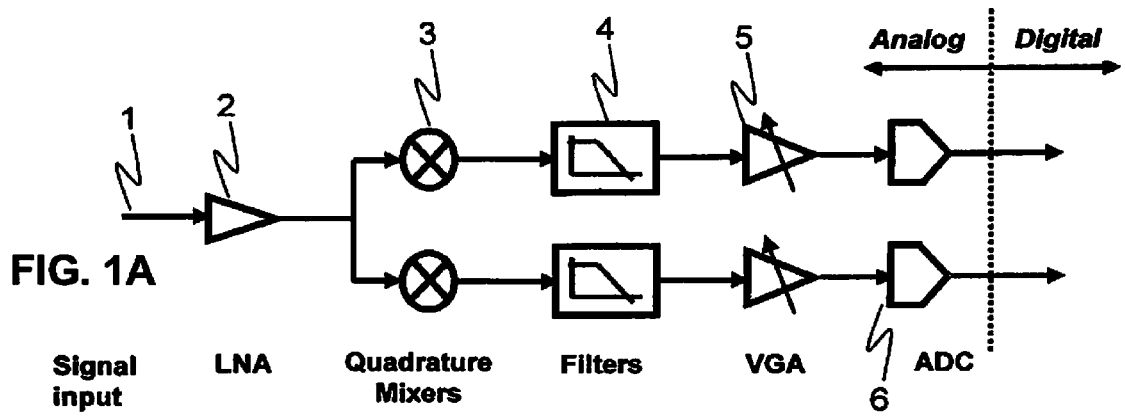
Figure 1B:
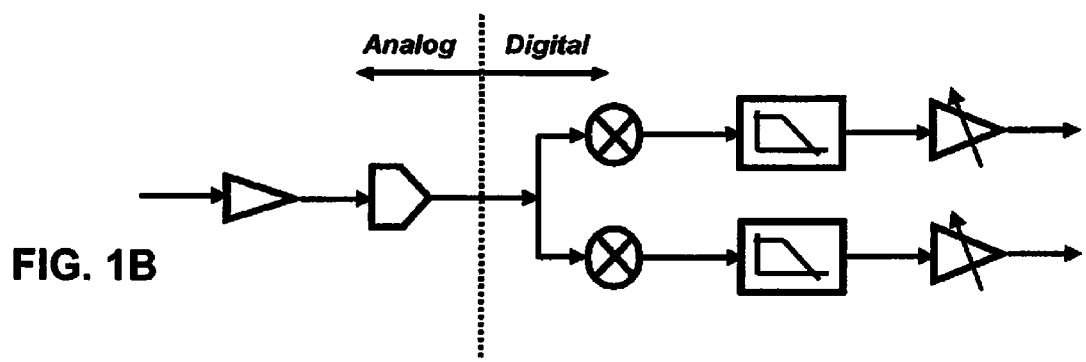
Figure 1C:
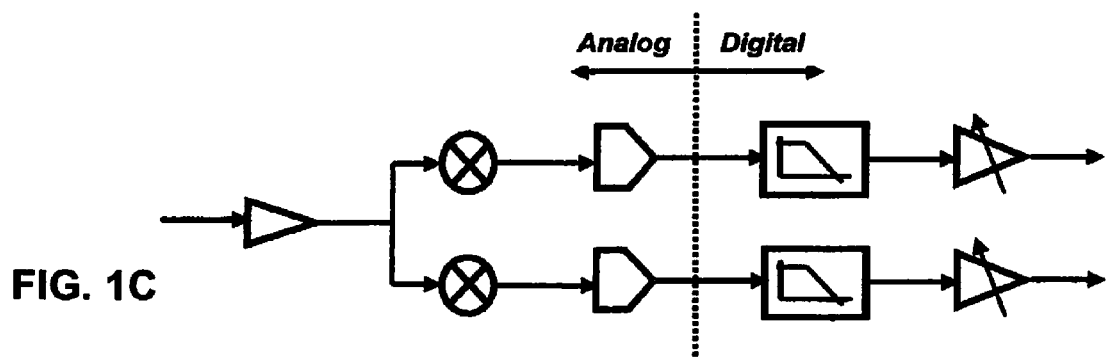
Figure 2A:
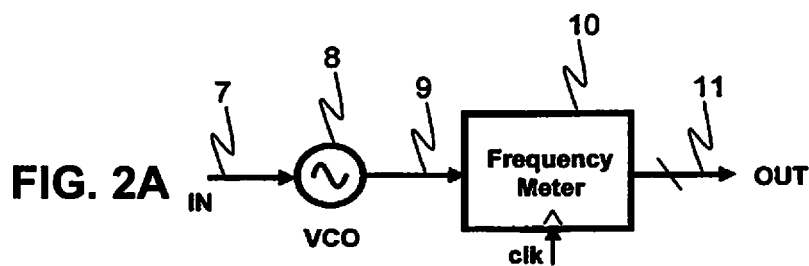
FIGS. 2A and 2B illustrate various implementations of Wireless communications devices.
Figure 2B:
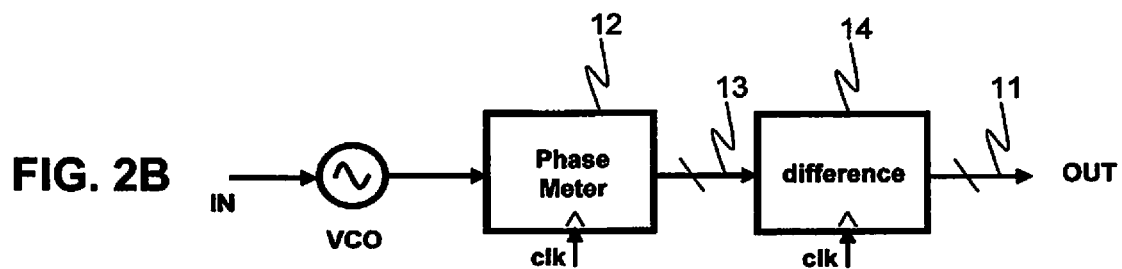

The invention makes use of a VCO-based Analog-to-Digital Converter. Such a Converter is already described in the State-of-the-art [1-3], but we repeat here the description, for a better understanding of the explanations further on:

In a VCO-based Converter (see FIG. 2a), the analog input signal (7) is applied to the input of a Voltage-Controlled Oscillator (8). As a result, the VCO output signal frequency (9) is a measure for the analog input. This frequency information is converted into a digital output signal (11) by means of a Frequency meter (10). Such frequency meter can be build with digital circuits. In this way, the analog input signal is converted into digital, in two steps.

It is sometimes easier to measure the Phase of the VCO, rather than its frequency. In such a case, a Phase meter (12) provides this Phase information (13). Taking the difference between the phases at two consecutive ticks of a reference clock yields a digital representation of the VCO's frequency and hence a digital representation (11) of the analog input signal.

Figure 3:
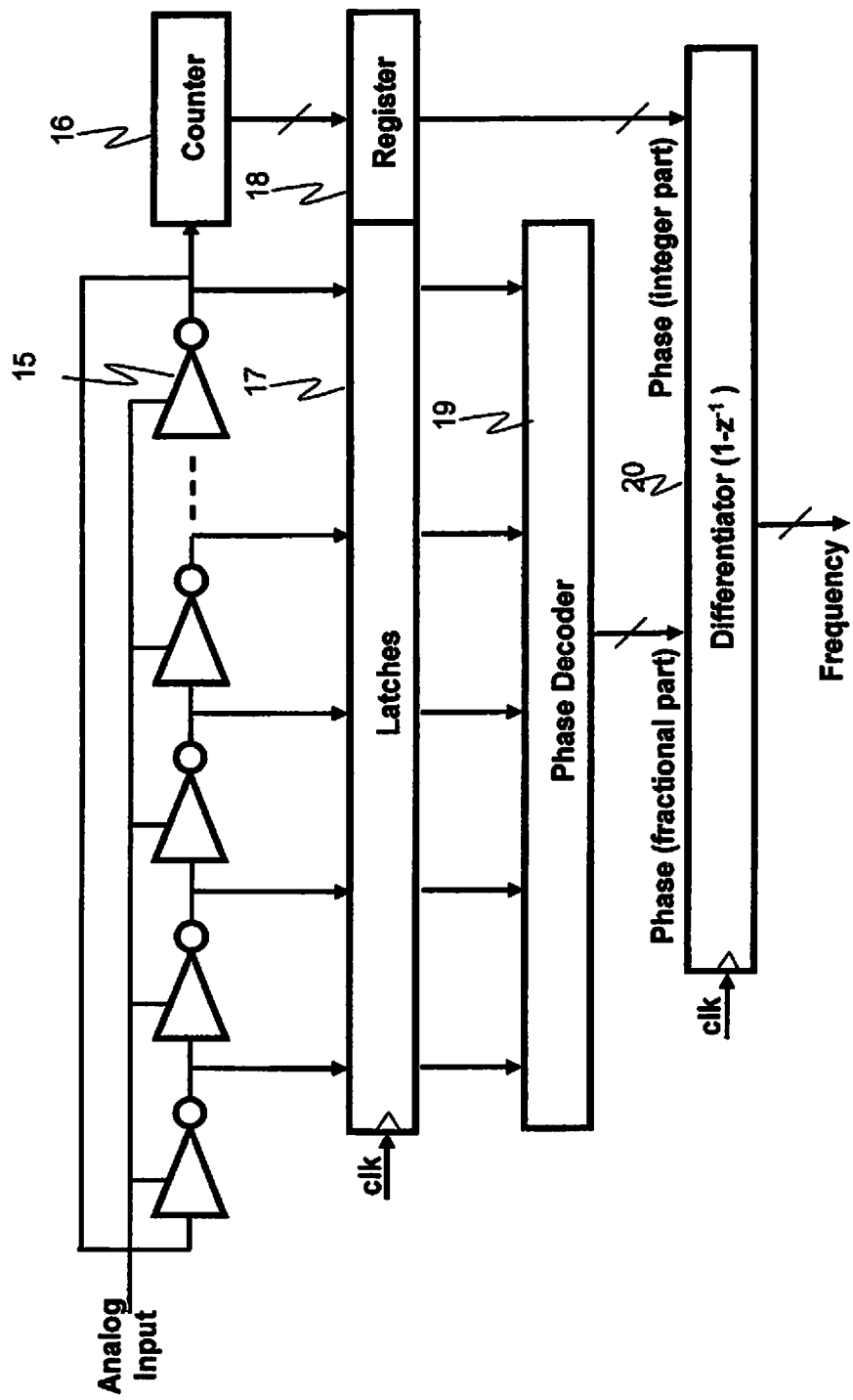
FIG. 3 shows a ring-oscillator based Analog-to-Digital Converter

A common realisation of such VCO-based Analog-to-Digital Converter is shown in FIG. 3: the VCO is a ring oscillator. It is well-known that the delay of the inverters (15), and hence the oscillation frequency, depends on the value of the supply voltage. Hence, by superimposing the input signal on the supply voltage, the oscillation frequency becomes a measure for the input signal. The number of oscillation periods can be counted by a digital counter (16). Furthermore, the oscillator's phase can be measured with a precision of better than a full period: a each clock tick, the signals on all inverter outputs can be stored in digital latches (17). From this information, it is possible to determine what portion of the ongoing oscillation period was already completed at the time of the clock tick. This is the task of the block (19). The number of oscillation periods completed plus the fraction of the ongoing oscillation period completed, constitutes a phase measurement with a resolution of one inverter delay. Differentiating this phase (20) yields a precise frequency measurement.

The oscillator's phase is measured with a resolution of one inverter's delay. In a modern CMOS silicon technology, inverter delays in the order of 10 psec. can be realised. Thanks to this precise measurement, this Analog-to-Digital Converter offers a low-noise performance. SNR of 90 dB over a 10-MHz bandwidth can be reached with a power consumption of a few mA. The SNR improves when reducing the inverter's delay or when increasing the reference clock frequency. Furthermore, SNR improves when the slope of the Voltage-to-Frequency characteristic is increased.

The main drawback of this type of Analog-to-Digital Converter is its nonlinearity: the linearity is only as good as the linearity of the Voltage-to-Frequency characteristic of the VCO. An example of such a characteristic is depicted in FIG. 5a). As can be noted, there is an important curvature.

Figure 4:
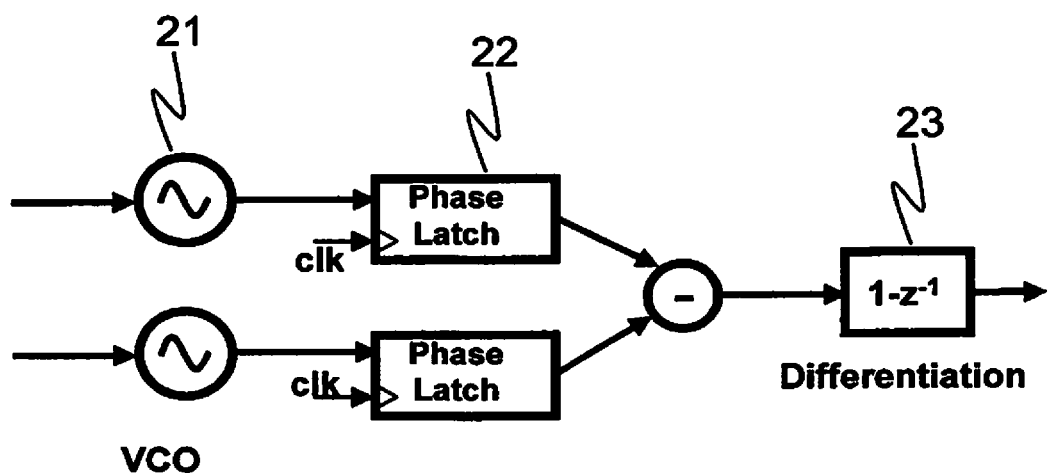
FIG. 4 shows a VCO-based Analog-to-Digital Converter with improved linearity and sampling rate.

This main drawback can be improved by means of the circuit of FIG. 4. It consists of two VCOs (21), two Phase latches (22) (actually, this Phase latch block encompasses the functions (16), (17), (18) and (19) described before), a circuit for calculating the difference between the Phase latches outputs, and a differentiation circuit. The input voltages on the two VCO inputs are set to:

$$V_{in,1} = V_{bias} + V_{signal} \quad \text{(expression 1)}$$

and $$V_{in,2} = V_{bias} - V_{signal} \quad \text{(expression 2)}$$

Figure 5B:
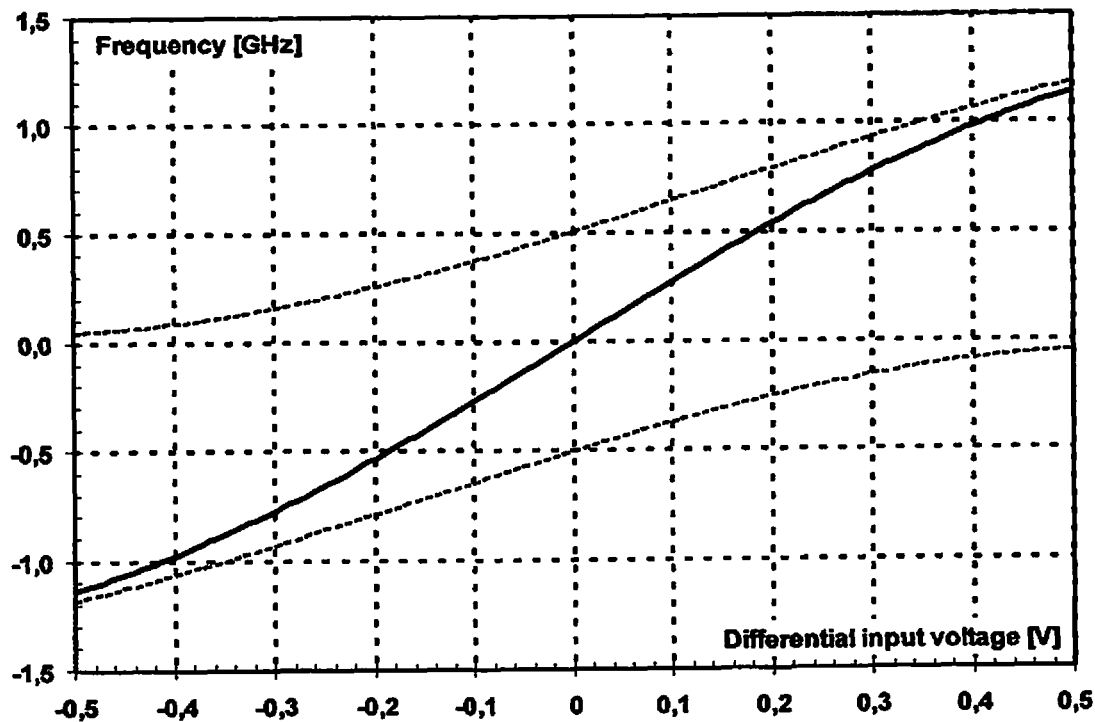

As a result, the frequency difference between the two oscillators depends on $V_{signal}$. The resulting input-to-frequency characteristic is shown in FIG. 5b).

This approach offers several advantages:
a) The output can now be positive as well as negative. It is centered around zero: when $V_{signal}$ is zero, the output is zero.
b) The resulting input-to-output characteristic is symmetrical around zero.
c) The output signal swing is twice as large.
d) Most important: the resulting input-to-output characteristic is more linear. This can be observed from FIG. 5: the curvature in FIG. 5b) is less than in FIG. 5a). It can also be calculated from a theoretical model: the second-order order nonlinearity disappears the third-order nonlinearity decreases by a factor of four. As a result, IP3 can be up to +20 dBm.

A second improvement on the VCO-based Analog-to-Digital Converter is shown in FIG. 6: As with any Analog-to-Digital Conversion of a signal, an Anti-Aliasing filter needs to be placed in front of the Analog-to-Digital Converter. A high sampling rate is advantageous, because it reduces the roll-off slope and hence the complexity of this Anti-Aliasing filter. It is possible to increase the effective sampling rate of the VCO-based Analog-to-Digital Converter by a factor of two: the circuit of FIG. 6 contains four Phase Latches (22), two are sampling the phases at the rising clock edge while two are sampling at the falling clock edge. For both sets, there is a subtractor and a differentiator (23). As a result, the VCO frequencies are sampled at twice the clock frequency. The two output signals can be combined into one digital signal with the double sampling rate. And as an additional advantage, this approach offers a SNR improvement of 3 dB.

FIG. 7 shows the incorporation of such a VCO-based Analog-to-Digital Converter in a Wireless communications signal receiver. The input signal (1) is applied to an LNA (2). Then, the signal is split into two identical paths: an In-Phase path (I-channel) and a Quadrature path (Q-channel). The signal is applied to a mixer (24) (in its most elementary form: four CMOS switches) and a small anti-aliasing filter (25). After buffering (26), the signal goes to a VCO-based Analog-to-Digital Converter with two VCOs (21), four phase latches (22), two subtractors and two differentiators (23). By means of a digital filter (27), all signal and noise energy at the clock frequency (Fclk) can be removed, after which the signal can be downsampled (28) to the clock frequency. Then, additional operations such as Offset Compensation (30), Variable gain (31), IQ Phase Mismatch Compensation (32) and Filtering (33) can be performed in the digital domain.

Thanks to the improvements to the VCO-based Analog-to-Digital Converter as described above, this block schematic meets the linearity and SNR requirements of common Wireless Communications systems such as GSM, LTE, WiFi, WiMAX, Bluetooth and others.

With some modifications on the block schematic, the same VCO-based Analog-to-Digital Converter can be used for Wireline communications standards. In general, it is advantageous in situations where the SNR requirements are more stringent than the SNDR requirements.

It should be well understood that the drawings and embodiments presented in this document are given for explanatory purposes, and that other embodiments of the principles of the invention may exist.

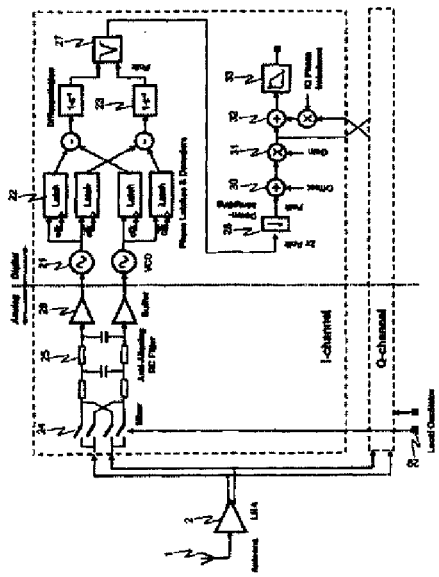

The invention claimed is:

1. An apparatus, comprising:
a first voltage-controlled oscillator connected to receive a first non-constant analog signal and configured for providing a second non-constant signal having a frequency depending on the value of the first signal;
a first and a second detector, each connected to receive the second signal; and
a reference clock configured to provide a reference clock signal to the first and second detectors,
wherein,
the first detector is configured to provide a first discrete-time signal representative of first time-interval averaged frequencies of the second signal, the time-interval being determined by two rising edges of the reference clock signal; and
the second detector is configured to provide a second discrete-time signal representative of second time-interval averaged frequencies of the second signal, the time-interval being determined by two falling edges of the reference clock signal.

2. The apparatus of claim 1, wherein the first and second detectors each comprise a phase detector configured to provide a phase signal representative of a phase of the second signal, each phase detector being connected to a distinct phase-to-frequency converter configured to determine the corresponding first or second discrete-time signal out of the phase signal.

3. The apparatus of claim 1 further comprising a circuit connected to the first and second detectors, wherein the circuit is configured to combine the first and second discrete-time signals into a signal with a higher sampling rate than the first or second discrete-time signals.

4. The apparatus of claim 1, wherein the two rising edges are two consecutive rising edges and the two falling edges are two consecutive falling edges.

5. The apparatus of claim 1, wherein the time-intervals of the first and the second detectors have equal length, wherein the apparatus further comprises a circuit connected to the first and second detectors and wherein the circuit is configured to combine the first and second discrete-time signals into a signal with a sampling rate twice the sampling rate of the first or second discrete-time signals.

6. The apparatus of claim 1, wherein the voltage controlled oscillator is a ring oscillator.

7. The apparatus of claim 6, wherein the ring oscillator comprises a sequence of CMOS inverters, each one comprising at least a first transistor, and wherein an additional transistor is arranged in series with the first transistor of at least one inverter, and wherein a gate of the additional transistor is connected to provide an input to the ring oscillator.

8. The apparatus of claim 6, wherein the ring oscillator comprises a sequence of inverters, wherein a plurality of said inverters are connected to the first detector and to the second detector to provide a plurality of oscillating signals as inputs to the first and second detectors and wherein the plurality of oscillating signals are used in the first and second detectors to determine the first and second discrete-time signals.

9. The apparatus of claim 1 further comprising:
a second-voltage controlled oscillator being connected to receive a third non-constant analog signal, wherein the second-voltage controlled oscillator is configured for providing a fourth non-constant signal having a frequency depending on the value of the third analog signal; and
a third and a fourth detector, each connected to receive the fourth analog signal,
wherein the reference clock is configured to provide the reference clock signal to the third and fourth detectors,
wherein the third detector is configured to provide a third discrete-time signal representative of first time-interval averaged frequencies of the fourth signal, the time-interval being determined by two rising edges of the reference clock signal, and
wherein the fourth detector is configured to provide a fourth discrete-time signal representative of second time-interval averaged frequencies of the fourth signal, the time-interval being determined by two falling edges of the reference clock signal.

10. The apparatus of claim 9, wherein the first and third analog signals are configured to be differential signals.

11. The apparatus of claim 9 further comprising a differencing circuit connected to the detectors, wherein the differencing circuit is configured to provide a first output representative of the difference between the first and the third discrete-time signals and a second output representative of the difference between the second and the fourth discrete-time signals.

12. The apparatus of claim 11, wherein the first to fourth detectors are phase detectors and wherein the first to fourth discrete-time signals carry phase information of the respective second and fourth analog signals.

13. The apparatus of claim 12, wherein the first and second outputs of the differencing circuit are connected to a differentiation circuit configured to distinctly differentiate the first and second outputs to obtain discrete-time signals carrying time-interval averaged frequency data of the respective second and fourth analog signal.

14. The apparatus of claim 1, wherein the first voltage-controlled oscillator and the first and second detectors form part of an analog-to-digital converter circuit, the apparatus further comprising a radio-frequency antenna connected to provide the voltage-controlled oscillator with the first analog signal.

15. An apparatus comprising:
a first voltage-controlled oscillator connected to receive a first non-constant analog signal, wherein the first voltage-controlled oscillator is configured for providing a second non-constant signal having a frequency depending on the value of the first analog signal;
a first and a second phase detector, each connected to receive the second analog signal;
a reference clock configured to provide a reference clock signal to the first and second phase detectors; and
a first and a second phase-to-frequency converter connected to the first and the second phase detector, respectively, wherein:
the first and the second phase detectors are each configured to provide respective first and second discrete-time phase signals carrying phase information related to the second signal, the first discrete-time phase signal being sampled at first time-periods corresponding to rising edges of the reference clock signal and the second discrete-time phase signal being sampled at second time-periods corresponding to falling edges of the reference clock signal, and
the first and second phase-to-frequency converters are configured to respectively provide first and second discrete-time signals representative of time-interval averaged frequencies determined from the first and the second discrete-time phase signals, respectively.

16. The apparatus of claim 15 further comprising:
a second voltage-controlled oscillator connected to receive a third non-constant analog signal, wherein the second voltage-controlled oscillator is configured for providing a fourth non-constant signal having a frequency depending on the value of the third analog signal;
a third and a fourth phase detector, each connected to receive the fourth analog signal; and
a third and a fourth phase-to-frequency converter connected to the third and the fourth phase detector, respectively,
wherein:
the reference clock is configured to provide the reference clock signal to the third and fourth phase detectors;
the third and the fourth phase detectors are each configured to provide respective third and fourth discrete-time phase signals carrying phase information related to the fourth analog signal, the third discrete-time phase signal being sampled at the first time-periods and the fourth discrete-time phase signal being sampled at the second time-periods,
the third and fourth phase-to-frequency converters are configured to respectively provide third and fourth discrete-time signals representative of time-interval averaged frequencies determined from the third and the fourth discrete-time phase signals, respectively.

17. The apparatus of claim 16, wherein the first and the third analog signals are differential signals.

18. The apparatus of claim 15, being incorporated in an analog-to-digital converter circuit.

19. An apparatus, comprising:
an input configured to receive a first non-constant analog input signal and a third non-constant analog input signal being the two polarities of a differential analog signal;
a reference clock input configured to provide a reference clock signal;
a first and a second voltage controlled oscillator connected to receive respectively said first analog signal and said third analog signal and configured for providing respectively a second non-constant signal and a fourth non-constant signal having frequencies depending on the values of respectively the first and the third analog signal;
a first and a second detector connected to receive respectively the second signal and the fourth signal, and each configured to provide a discrete-time signal representative of time-interval averaged frequencies of the second or the fourth signal respectively, the time-interval being equal for both detectors and being derived from said reference clock signal;
a differencing circuit configured for calculating the difference of the discrete-time signals provided by the first and the second detector.

20. The apparatus of claim 19, wherein the first and the second detectors are phase detectors and wherein the discrete-time signals are phase information signals, and further comprising a differentiation circuit connected to the differencing circuit to derive an average frequency from the phase information signals.

21. The apparatus of claim 20, wherein the phase detectors are configured for counting a number of oscillation periods and a fraction of an ongoing oscillation period of respectively the second and fourth signals occurring during the time-interval.

22. The apparatus of claim 19, wherein the voltage controlled oscillators are ring oscillators.

23. The apparatus of claim 22, wherein the ring oscillators each comprise a sequence of CMOS inverters, each one comprising at least a first transistor, and wherein an additional transistor is arranged in series with the first transistor of at least one inverter, and wherein a gate of the additional transistor is connected to provide an input to the ring oscillator.

24. The apparatus of claim 19, comprising a radio-frequency antenna connected to provide an analog input signal and a biasing circuit connected to provide the differential analog signal from the analog input signal.

* * * * *

UNITED STATES PATENT AND TRADEMARK OFFICE
CERTIFICATE OF CORRECTION

| | | |
|---|---|---|
| PATENT NO. | : 8,760,333 B2 | |
| APPLICATION NO. | : 13/392851 | |
| DATED | : June 24, 2014 | |
| INVENTOR(S) | : Op 't Eynde | |

It is certified that error appears in the above-identified patent and that said Letters Patent is hereby corrected as shown below:

The Title page, showing the illustrative figure, should be deleted and substitute therefor the attached Title page.

In the Drawings:

Delete fig. 7 and substitute therefor the drawing sheet, consisting of fig. 7 as shown on the attached page.

Signed and Sealed this
Second Day of December, 2014

Michelle K. Lee
*Deputy Director of the United States Patent and Trademark Office*

(12) United States Patent
Op 't Eynde

(10) Patent No.: US 8,760,333 B2
(45) Date of Patent: Jun. 24, 2014

(54) VOLTAGE CONTROLLED OSCILLATOR (VCO) BASED ANALOG-DIGITAL CONVERTER

(76) Inventor: Frank Op 't Eynde, Leuven (BE)

( * ) Notice: Subject to any disclaimer, the term of this patent is extended or adjusted under 35 U.S.C. 154(b) by 155 days.

(21) Appl. No.: 13/392,851

(22) PCT Filed: Aug. 28, 2009

(86) PCT No.: PCT/BE2009/000046
§ 371 (c)(1),
(2), (4) Date: Feb. 27, 2012

(87) PCT Pub. No.: WO2011/022789
PCT Pub. Date: Mar. 3, 2011

(65) Prior Publication Data
US 2012/0154192 A1 Jun. 21, 2012

(51) Int. Cl.
H03M 1/12 (2006.01)

(52) U.S. Cl.
USPC .................................. 341/155; 331/11

(58) Field of Classification Search
USPC ............ 341/155, 157; 318/268, 600; 331/11, 331/16, 34; 327/156
See application file for complete search history.

(56) References Cited

U.S. PATENT DOCUMENTS

| | | | |
|---|---|---|---|
| 5,189,420 A | 2/1993 | Eddy et al. | |
| 6,396,890 B1* | 5/2002 | Turner | 375/376 |
| 6,809,676 B1 | 10/2004 | Younis et al. | |
| 7,173,501 B1* | 2/2007 | Varricchione | 331/176 |
| 8,283,984 B2* | 10/2012 | Lin | 331/11 |
| 2007/0229118 A1* | 10/2007 | Kobayashi et al. | 327/3 |
| 2012/0087420 A1* | 4/2012 | Kim | 375/259 |

OTHER PUBLICATIONS

International Search Authority/European Patent Office (ISA/EP). International Search Report, Application No. PCT/BE09/00046. Aug. 17, 2010.
International Preliminary Examining Authority/European Patent Office (IPEA/EP). International Preliminary Report on Patentability, Application No. PCT/BE09/00046. Sep. 26, 2011.
Hovin, Mats, et al. "Delta-Sigma Modulators Using Frequency-Modulated Intermediate Values." IEEE Journal of Solid-State Circuits, vol. 32, No. 1, pp. 13-22 (Jan. 1997).
Park, Matt, et al. "A 0.13 μm CMOS 78dB SNDR 87 mW 20 MHz BW CT ΔΣ ADC with VCO-Based Integrator and Quantizer." Solid-State Circuits Conference—Digest of Technical Papers, 2009, pp. 170-171, 171a. ISSCC 2009. IEEE International. Presented at 2009 IEEE International Solid-State Circuits Conference, Feb. 10, 2009.
Watanabe, Takamoto, et al. "An All-Digital Analog-to-Digital Converter With 12-μV/LSB Using Moving Average Filtering." IEEE Journal of Solid-State Circuits, vol. 38, No. 1, pp. 120-125 (Jan. 2003).

* cited by examiner

Primary Examiner — Peguy Jean Pierre
(74) Attorney, Agent, or Firm — The Marbury Law Group, PLLC

(57) ABSTRACT

A signal receiver contains a VCO-based Analog-to-Digital Converter. As a result, some building blocks can be migrated into the digital domain.

24 Claims, 7 Drawing Sheets